United States Patent [19]

Harding et al.

[11] 4,128,466
[45] Dec. 5, 1978

[54] METHOD AND APPARATUS FOR REACTIVE SPUTTERING

[75] Inventors: Geoffrey L. Harding; David R. McKenzie; Brian Window, all of Sydney, Australia

[73] Assignee: The University of Sydney, Sydney, Australia

[21] Appl. No.: 803,334

[22] Filed: Jun. 3, 1977

[30] Foreign Application Priority Data

Jun. 10, 1976 [AU] Australia ............................. PC6228

[51] Int. Cl.² .......................................... C23C 15/00
[52] U.S. Cl. ............................ 204/192 C; 204/192 R; 204/192 P; 204/298
[58] Field of Search ................. 204/192 R, 192 C, 298

[56] References Cited

U.S. PATENT DOCUMENTS

| 3,725,238 | 4/1973 | Fischbein et al. | 204/298 |
| 3,976,555 | 8/1976 | Von Hartel | 204/192 |
| 3,979,273 | 9/1976 | Panzera et al. | 204/192 |
| 4,006,070 | 2/1977 | King et al. | 204/192 |

FOREIGN PATENT DOCUMENTS

45-4608  2/1970  Japan ...................................... 204/298

OTHER PUBLICATIONS

C. H. George, "Cylindrical Diode Continuous Vacuum Sputtering Equipment for Laboratory & High Volume Production," J. Val. Sci. Technol., vol. 10, pp. 393–397, (1973).
E. D. McClanahan et al., "Initial Work on the Application of Protective Coatings to Marine Gas Turbine Components by High Rate Sputtering", ASME Publication, 74–GT–100, (1974).

*Primary Examiner*—John H. Mack
*Assistant Examiner*—Aaron Weisstuch
*Attorney, Agent, or Firm*—Ladas, Parry, Von Gehr, Goldsmith & Deschamps

[57] ABSTRACT

A reactive sputtering process is described for producing a thin film of sputtered material on a tubular substrate which may, for example, be a solar collector tube. Uniformity of the composition of the sputtered layer at all points at the same depth in the film is achieved by preventing the movement of reactive gases through which the sputtering has already taken place, from one part of the zone of sputtering to another. In one way of achieving this result the reactive gas is swept from the zone of sputtering by entraining it in a gas stream flowing across the sputtering path. In an alternative way of achieving this result the rate of flow of reactive gas is finely controlled so that it is entirely consumed in one discrete area of sputtering so that there are no components of the reactive gas remaining which are free to move to other parts of the zone of sputtering and thereby change the atmospheric conditions in it. Apparatus for carrying out these two functions is described and utilizes tubes, which may be electrodes, formed with lines of holes or openings extending parallel to the axis of the tubular substrate on which the sputtered film is to be formed.

12 Claims, 3 Drawing Figures

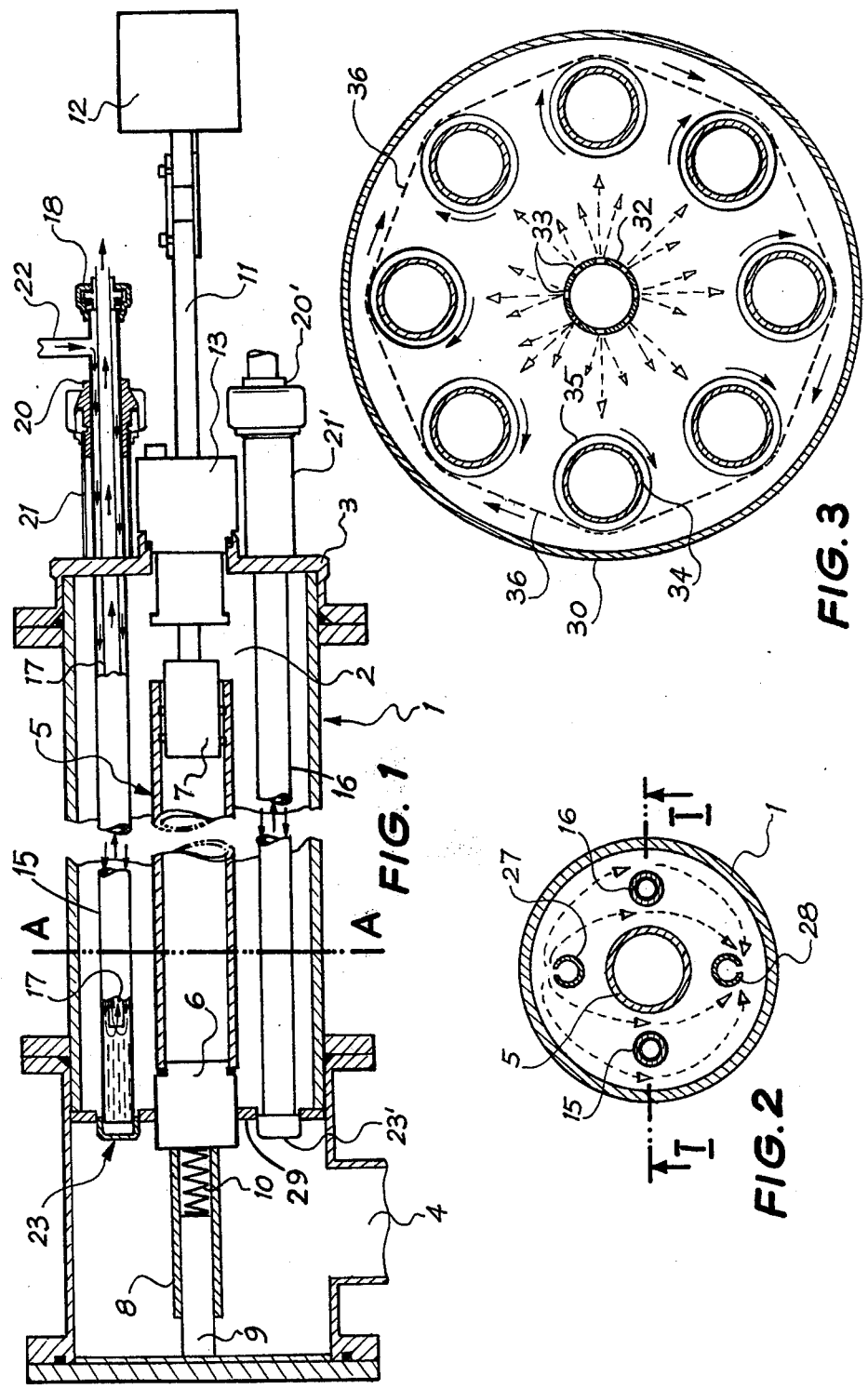

METHOD AND APPARATUS FOR REACTIVE SPUTTERING

FIELD OF THE INVENTION

This invention relates to plasma sputtering and is more particularly concerned with a sputtering technique known as reactive sputtering.

STATE OF THE ART

The sputtering technique is currently used to provide a film of highly reflecting metal such as chromium on a substrate. The chromium is ejected from a metal electrode which is bombarded with ions or atoms as a result of an electrical discharge produced in an inert gas between an anode and the chromium electrode which is made the cathode. The inert gas is normally argon at low pressure.

Reactive sputtering is a variant of the above sputtering technique, in which the inert gas is mixed with a small quantity of a gaseous impurity which provides atoms of a different material which are deposited on the surface to be coated simultaneously with the sputtered metal of the cathode electrode. One such gaseous impurity is a hydro-carbon gas which breaks down to provide carbon atoms so that the sputtered layer is a metal carbide. Sputtered oxide and nitride layers can be produced by the reactive sputtering technique also.

Recent development work in the field of solar energy collector tubes and described in the Journal of Vacuum Science Technology, Vol. 13 No. 5 Sept/Oct 1976 (published by the American Vacuum Society) on page 1070 in an article entitled "Sputtered Metal Carbide Solar Selective Absorbing Surfaces", has shown that the efficiency of a collector tube can be enhanced if it is coated with a uniformly thin layer of material having a composition which is the same from one point to another at all points at the same depth in the layer, and certain other properties. Unfortunately, this cannot be achieved by conventional reactive sputtering because experimental work has shown that the amount of the impurity gas present at different locations in the sputtering zone is not always the same. As a result, the density of impurity atoms which arise from the impurity gas, is not the same at all points on the surface of the layer being deposited onto the substrate.

OBJECT OF THE INVENTION

An object of this invention is the provision of an improved process and apparatus for carrying out reactive sputtering.

THE PROCESS OF THE INVENTION

In accordance with the present invention there is provided a process for producing a sputtered layer of relatively uniform composition and thickness on an elongated tubular substrate by reactively sputtering atoms from a gaseous impurity and from a metal electrode simultaneously onto the surface of the substrate in a sputtering zone extending lengthwise of the substrate, in which process the electrode is arranged with its surface parallel to the surface of the substrate and relative rotational movement is produced between the two surfaces so that the substrate is progressively coated around its circumference with sputtered material, while the flow of gas impurity is so controlled in the sputtering zone that its flow between different regions along the length of the sputtering zone is minimised or prevented.

The advantage of the invention is that the conditions under which the substrate surface is coated can be maintained so that the consistency, quality, and thickness of the coating can be accurately maintained also. In prior art reactive sputtering processes, the gaseous impurity sweeps along the substrate surface while sputtering is taking place so that different parts of the surface are sputtered in different atmospheres and the sputtered layer produced does not have the necessary uniformity of quality and thickness necessary for a selective layer of a solar energy collector, for example.

PREFERRED FEATURES OF THE INVENTIVE PROCESS

In one way of carrying out the process of the invention the gaseous impurity is directed to flow along a path which lies in the zone of sputtering and extends between the electrode and the substrate. In the process the rate of admission of the gaseous impurity is substantially equal to its rate of consumption in the sputtering process, i.e. it is admitted in a carefully controlled manner. In each region of the zone of sputtering, the gas admitted to it is consumed so that there is effectively no surplus impurity gas which can flow to an adjacent region and change the atmospheric conditions there. The "quality" of the atmosphere throughout the sputtering zone can therefore be maintained. The impurity gas is preferably directed towards the substrate from holes provided in a tubular pipe connected to a carefully controlled source of impurity gas. The inert gas, e.g. argon, is admitted into the chamber via an inlet and extracted from the chamber using an outlet so that the partial pressure of the inert gas remains constant in time and the inert gas atmosphere is replaced at such a rate as to prevent the build-up of impurity gases other than the one admitted intentionally. Such impurities can arise during the sputtering process by release of gases trapped in or on the surfaces exposed to the lowered pressure.

In another way of carrying out the process of the invention, movement of impurity gas between different points in the sputtering zone is prevented by directing the gaseous impurity and inert gas in which it is entrained to flow at right-angles to the tubular substrate. The gas flowing from the zone of sputtering is drawn towards a gas outlet maintained under suction. The gas outlet conveniently comprises a suction tube extending lengthwise of an elongated cavity parallel to the axis of the electrode and the substrate. Surplus impurity gas is entrained in the inert gas flow and is therefore confined to move across the zone of sputtering and is swept away from the zone before it can travel from one region of the zone of sputtering to another. In this way of carrying out the invention the impurity gas may either be admitted to the chamber after mixing with the inert gas and/or the inert gas may be admitted separately.

THE APPARATUS OF THE INVENTION

The invention also includes apparatus for carrying out reactive sputtering to produce a coated layer on an elongated tubular substrate, such apparatus comprising an elongated electrode, mounts for supporting the tubular substrate in spaced parallel relationship to the electrode, an envelope defining a chamber in which sputtering between the electrode and the substrate is to take place, first means for admitting a gaseous impurity to the chamber, second means for controlling the flow of gaseous impurity in a sputtering zone between the electrode and the substrate so that flow of the gaseous impurity between different regions spaced lengthwise of the sputtering zone is prevented or minimised, and third means for producing relative rotational movement without axial displacement between the electrode and the substrate whereby all points on its circumference pass through the zone of sputtering along which material from the length of the electrode sputtered simultaneously towards the substrate.

PREFERRED FEATURES OF THE INVENTIVE APPARATUS

In one such apparatus there is provided an exhaust for establishing and/or maintaining the zone in which sputtering takes place at a low pressure, inlet means for admitting an inert gas and a controlled amount of gaseous impurity into the zone, and, an outlet for withdrawing gas and any surplus impurity gas from the zone; in which apparatus the inlet means and the outlet are so disposed with respect to the position of the substrate to be coated, that the gas flow between them extends substantially across, rather than in a plane defining a zone along which sputtered material from the electrode travels towards the position of the substrate. Sputtering takes place simultaneously at all points along the zone so that, to coat the tubular substrate, it may be held against axial movement and simply rotated about its axis to cover its surface with sputtered material.

In one variation of apparatus, a batch of tubular substrates, arranged with their axes parallel, are coaxially mounted in a ring around a central fixed electrode whose length is approximately equal to or longer than the length of the substrate to be sputtered. The substrates are each rotated about their respective axes during sputtering so that a batch of them is coated in a single sputtering operation. The impurity gas may be admitted through holes in the electrode, which may be tubular for this purpose, at a controlled rate so that its rate of admission to the sputtering zone equals its rate of consumption in the sputtering process. In another variation of apparatus, a batch of tubular substrates, arranged with their axes parallel, are co-axially mounted in a ring and contained within a hollow cylindrical electrode whose axis is parallel to the tube to be coated.

One form of apparatus, found particularly suitable for sputtering a cylindrical tubular substrate, has the substrate tube extending axially of a cylindrical chamber or envelope. The sputter electrode extends lengthwise of the annulus formed between the substrate tube and the cylindrical wall of the chamber. The inlet and outlets are also arranged within the annulus at respectively diametrically opposite positions with respect to the electrode and suitably take the form of straight tubes having holes distributed along their lengths and preferably directed outwardly towards the cylindrical wall of the chamber. The electrode conveniently is in the form of a rod extending in spaced parallel relationship to the substrate tube midway between the inlet and outlet tubes. During the sputtering process, part of the material of the electrode is sputtered towards the substrate and travels transversely of the gas flow from the holes of the inlet tube to the holes of the outlet tube. As in the preferred arrangement these holes are directed outwardly, they also serve to sweep towards the outlet tube impurities located between the chamber wall and the sputter electrode. As sputtering progresses, the tube is rotated, suitably at a uniform speed, to build up an even layer of sputtered material throughout its length.

The invention will now be described in more detail, by way of example, with reference to the accompanying drawings, in which:

IN THE DRAWINGS

FIG. 1 is a diagrammatic section, partly broken away, of apparatus for sputter coating a cylindrical tube of a solar energy collector and taken on the line I—I of FIG. 2;

FIG. 2 is a diagrammatic cross-section taken through the central portion of the apparatus of FIG. 1 along the plane A—A; and, FIG. 3 is a diagrammatic cross-section through sputtering apparatus for simultaneously coating a batch of tubular substrates.

PREFERRED EMBODIMENT

FIG. 1 shows apparatus comprising a glass envelope, 1, providing a cylindrical chamber 2 having one end closed by an apertured cap 3 and the other end communicating with an exhaust 4, extending to a high vacuum pump, not shown.

A cylindrical substrate tube 5 extends axially through the chamber 2 and it is plugged at its ends by plug support mounts 6 and 7. The mount 6 is spring-loaded towards the mount 7 by an assembly formed by a cylindrical sleeve 8 slidably mounted on a pin 9 and containing a compression spring 10. The assembly allows the mount 6 to rotate. The second mount 7, is positioned at one end of a shaft 11 which extends to an electric motor 12 and passes through a rotary sealing plug 13 provided in the centre of the cap 3.

The outside of the tube 5 and the inside surface of the envelope 1 define an annulus, which, as shown in FIG. 2, contains a pair of electrodes 15, 16 which are diametrically arranged. These electrodes are each tubular and are identically constructed although the electrode 15 is made from stainless steel whereas the electrode 16 is made from copper. As is shown in FIG. 1, the electrode 15 contains an axially extending pipe 17 which is open at its end inside the electrode and projects at its outer end through a closure 18 to a cooling water outlet, not shown. The wall of the electrode 15 passes through a sealing plug 20 fitted into the end of an insulating tube 21 sealed to the cap 3. A branch entry 22 allows cold water to be circulated through the electrode 15 and out through the pipe 17 as shown by arrows. A glass insulator 23 mounted in a support plate 29 supports the inner closed end of the electrode 15. This glass insulator does not extend through the full thickness of the support plate 29 so that the insulator is not itself coated with conducting material during sputtering.

Parts of the electrode 16 corresponding to those of the electrode 15 bear the same reference numerals but they are primed, and they will not be separately described.

Arranged in the annulus at positions midway between the tubular electrodes 15 and 16 are an inlet tube 27 and an outlet tube 28 as shown in FIG. 2. They each pass through seals in the cap 3 and are closed at their ends inside the envelope 1. Their other or outer ends extend, respectively, to a source of argon containing a controlled amount of gaseous impurity in the form of methane, and to a vaccum pump.

Each of the tubes 27 and 28 is made of copper and has a line of holes distributed along its length on the side facing the outside of the annulus. In the case of the gas inlets, the aggregated cross-section through which gas flows into the chamber is less than the aggegated cross-section of the holes in the gas outlet pipe, so that, under steady operating conditions, a constant low mean pressure is maintained in the chamber 2 and the gas flow in it sweeps arcuately around the two halves of the annulus with negligible flow axially of the annulus.

OPERATION OF PREFERRED EMBODIMENT

The apparatus is operated when under low gas pressure.

The electrically conducting parts of the apparatus with the exception of the copper electrode 15 are earthed and the copper electrode has a negative potential with respect to earth applied to it. An ion discharge occurs in the chamber 2 and the impact of positive ions on the copper electrode causes metallic copper to be sputtered off radially.

Some of this copper is sputtered on to the outside wall of the substrate tube 5 which is rotated. During this initial stage of coating the substrate tube with a copper layer, pure argon only is fed between the inlet tube 27 and the outlet tube 28. The process is therefore a conventional plasma sputtering process. If desired, the sputtering can take place without the argon being passed through the chamber 2 although this is much to be preferred.

When the layer of copper coating on the tube 5 has the desired thickness, which is determined empirically by the parameters under which it is sputtered, a layer in the form of a metallic film, having a high degree of infra-red reflectivity, is formed.

The connections of the electrodes 15 and 16 are then reversed and the pure argon is replaced by a stream of argon with a controlled amount of methane as impurity in it.

Reactive sputtering now takes place between the electrode 16 and the copper layer or coating on the substrate 5. The reactive sputtering results in carbon and iron, chromium and nickel from the stainless steel electrode 16 being deposited on the top of the copper layer continuously along its length. The sputtering process is continued for a time which is determined empirically as being that necessary to create the desired thickness of a metal carbide coating on the tube 5. This is determined by parameters which are fixed and known during the sputtering. As the flow of gas inside the annulus is substantially confined to the same plane as the direction of discharge of the sputtered metal, and the gas flow travels across, and not in, the planar zone in which metal is sputtered from the electrode to the tube 5, the gas conditions through which sputtering is occurring between the electrode and the tube 5 are the same throughout the length of the tube. Consistency of thickness and composition of the sputtered layer is therefore assured because the gas through which sputtering has occurred is withdrawn from the annulus 2 before it has time to recirculate in an axial direction to other regions of the zone of sputtering.

Various metals may be used for the sputtering layer to provide the high reflectivity coating on the substrate tube. For example, silver, or gold may be used in place of copper. Likewise, instead of stainless steel for the electrode 16, other metals may be used such as molybdenum, chromium, iron, tungsten, nickel, tantalum or even titanium although results are not so good when titanium is used. Likewise, although methane and argon is the preferred gas mixture for the reactive sputtering, other hydro-carbons or gas impurities may be used in accordance with the composition of the layer required and other gases to provide silicides, borides and other compositions may be used as the impurity gas.

Best results are achieved when the chamber 2 is evacuated to a pressure less than $10^{-6}$ Torr for several hours so that there is a negligible concentration of residual gases in the chamber which could contaminate the inert gas which flows through the system during the first sputtering stage. Typically, the copper is sputtered with a potential of minus 1400 volts on the copper electrode and at a gas pressure in the chamber 2 of 0.2 Torr. A larger flow rate or argon gas should be maintained through the chamber during the copper sputtering stage.

The concentration of methane in the argon during the second sputtering stage depends on the sputtering current, the surface area of the sputter electrode and on the flow rate. The methane concentration determines the composition of the carbide film as to the ratio of metal to carbon atoms in the coating. An indication of this composition is the electrical resistance per square. It is found in practice that the optimum quality of film results when the electrical resistance per square of the metal carbide film is between 10 kilohms and 1 megohm. The deposition is continued until a thickness of about $10^{-7}$ meters of metal carbide film has built up.

The following details relate to an experimental use of the above described apparatus:

| | |
|---|---|
| Coating Voltage | 1400V |
| Coating Current | 300mA |
| Coating time for Double Layer (Copper plus mixed iron, chromium and nickel carbides) | 50 Minutes |
| Pressure of gas (typical) | $1.5 \times 10^{-1}$ Torr |
| Composition of gas for carbide coating | 8% Methane in Argon |
| Substrate tube rotation speed | 11 R.P.M. |
| Length of Substrate Tube | 1.5m |
| Maximum diameter of Substrate Tube | 50mm |
| Gas Inlets | 1cm lengths of tube with 0.305mm diameter bore, 70mm centres in 13mm outer diameter tube of 1mm wall thickness. |
| Gas Outlets | 1mm diameter holes in tube of wall thickness 1mm, outer diameter 13mm, 100mm between hole centres. |
| Flow rate | 0.11 ml/sec at S.T.P. |
| Outer diameter of glass Chamber | 10cm |
| Wall thickness of Chamber | 5mm |
| Outer diameter of negative electrodes | 13mm |

SECOND EMBODIMENT

FIG. 3 shows, in cross-section, a modified form of apparatus for carrying out reactive sputter coating, in diagrammatic and greatly simplified form.

Sputtering is carried out in a cylindrical cavity provided inside a tubular electrode 30 of steel with its axis vertical and closed at its ends by end plates (not shown). The electrode 30 is provided with water cooling coils (not shown) wound around its exterior surface. A tubular copper electrode 32 extends axially through the centre of the cavity and is provided with eight axially extending lines of holes 33 and an internal U-tube (not shown) in contact with the copper electrode 32 and for water cooling. Each of these lines of holes 33 is directed towards a respective tubular substrate 34. Eight such substrates 34 are provided in a ring arranged concentrically around the electrode 32 and each substrate is mounted at its top end in a rotatable holder 35. Each holder 35 is driven via a pinion (not shown) from a flexible chain drive (shown by a broken line) driven from a rotating draft (not shown) passing through a seal in the top end-plate of the cavity. The end-plates of the cavity are held at earth potential and are insulated from the outer electrode 30 by 'O' rings of a cross-sectional diameter such that a gap of between 1 and 2mm exists between the annular end face of the outer electrode 30 and each end plate. The annular gap around the lower end plate is fitted to an exhaust for connection to a vacuum pump. The central electrode 32 is insulated from the upper end-plate by a glass ring and passes through the end-plate through a hole whose diameter is larger than that of the electrode 32 by between 2 and 4mm.

OPERATION OF SECOND EMBODIMENT

If non-reactive sputtering is to be carried out to produce the first layer of a two layer coating on the substrate, the envelope is filled with argon at reduced pressure and the copper electrode 32 used as the cathode, or source of material and the end-plates and outer electrode are used as an anode. Argon gas is fed into the chamber through the holes in the copper electrode 32 and exhausted through the opening and around the bottom end-plate. Sputtering then takes place to deposit a film of copper on each of the tubular substrates which are rotated together so that a film of the same thickness is built up on each.

To provide the carbide layer on top of the copper layer, the copper electrode 35 is used as anode together with the end-plates, and the outer electrode 30 is used as the cathode, so that sputtering occurs from the steel outer envelope. Argon is fed in through an inlet in the top plate and methane admitted to the interior of the electrode 32 such that its rate of flow through the holes 33 is equal to its rate of consumption during sputtering. The conditions prevailing in the eight zones of sputtering are the same and, within each zone, are not dependant on the distance along the zone parallel to the substrate axis measured from the top end-plate. Consequently the carbide layer produced on the substrates is of uniform composition from one point to another on the substrate and the layer is of uniform thickness.

The apparatus shown in FIG. 3 has the advantage that it enables a batch of eight tubular electrodes to be coated at the same time.

The following details relate to an experimental use of the above apparatus of FIG. 3.

| | |
|---|---|
| Coating Voltage | 1000V |
| Coating Current | 2.5A |
| Coating Time for 8 tubes coated with double layer | 50 minutes |
| Total Pressure of gas (typical) | $1.5 \times 10^{-1}$ Torr |
| Substrate rotation speed | 11 R.P.M. |
| Length of substrate tubes | 1.5m |
| Diameter of substrate tubes | 22mm |
| Outer diameter of inner electrode | 25.4mm |
| Inner diameter of outer electrode | 150mm |
| Gas inlets | 1cm lengths of tube with 0.2mm dia. bore |
| | -continued |
| | 70mm centres |
| Argon gas flow rate | 0.5 ml sec$^{-1}$ |
| Methane flow rate (approximate) | 0.07 ml sec$^{-1}$ |

In carrying out the invention the inert gas may be admitted to the sputtering chamber either mixed with the impurity gas or through a separate inlet and is pumped out through an exhaust at such a rate as to maintain the pressure within the chamber at a chosen level.

The rate of emission of the inert gas can be controlled by a regulatable gas control valve connected to the supply of reactive gas and known per se to the man in the art.

We claim:

1. A process for applying a solar selective surface coating of substantially uniform composition and thickness to a substrate in the form of an elongate tube for use in a solar collector system; the process comprising reactively sputtering atoms from a gaseous impurity and from an elongate metal electrode simultaneously onto the surface of the substrate in a direct current induced plasma, and wherein:
    (a) the electrode is disposed parallel to the longitudinal axis of the substrate,
    (b) relative rotation about the axis of the substrate is effected between the substrate and the electrode,
    (c) the impurity gas is directed towards the substrate surface at an angle approximately normal to the longitudinal axis of the substrate and from delivery points spaced from the substrate surface but uniformly distributed along the length of the substrate, and
    (d) flow of the impurity gas is controlled to minimize migration thereof in a direction parallel to the longitudinal axis of the substrate.

2. The process as claimed in claim 1 wherein the gaseous impurity is directed to flow along a path lying in the zone of sputtering and extending between the electrode and the substrate, and wherein the rate of admission of the gaseous impurity is controlled to be substantially equal to its rate of consumption in the sputtering process.

3. The process as claimed in claim 1 wherein the electrode is provided with holes, constituting the delivery points, through which the gaseous impurity is admitted to the zone of sputtering.

4. The process as claimed in claim 2 in which the electrode is arranged co-axially with respect to a ring of spaced said tubular substrates which are rotated about their respective axes as the layer of sputtered material builds up on them.

5. The process as claimed in claim 4, in which the electrode comprises a rod co-axially arranged inside the ring.

6. The process as claimed in claim 4, in which the electrode is formed by the inside surface of a metal cylindrical envelope surrounding the ring of tubular substrates.

7. The process as claimed in claim 1 wherein the delivery points for the gaseous impurity are spaced from the electrode and the gaseous impurity is directed across the surface of the substrate to a gas outlet, the gaseous impurity being delivered to the zone of sputtering in an inert gas, and there being a pressure drop between the gas delivery points and the gas outlet.

8. The process as claimed in claim 7, in which the gas outlet comprises a suction tube extending lengthwise of an elongated chamber parallel to the axes of the electrode and the substrate.

9. The process as claimed in claim 1 in which the gaseous impurity used is selected to create a carbide or a silicide coating layer on the substrate.

10. A direct current reactive sputtering apparatus for use in applying a solar selective surface coating of a substantially uniform composition and thickness to a substrate in the form of an elongate tube for use in a solar collector system, the apparatus including:

(a) an envelope defining a chamber, (b) an elongate target electrode, (c) means for mounting the substrate within the chamber in spaced parallel relationship to the target electrode, (d) means for effecting relative rotation about the axis of the substrate between the target electrode and the substrate, (e) means for admitting a gaseous impurity into the chamber and directing the gaseous impurity toward the substrate at an angle approximately normal to the longitudinal axis of the substrate, said means including delivery point apertures spaced from the substrate surface but uniformly distributed along the length of the substrate, and (f) means for controlling the flow of the impurity gas to minimize migration thereof in a direction parallel to the longitudinal axis of the substrate.

11. Apparatus as claimed in claim 10, in which a ring of mounts is arranged to support a ring of circumferentially spaced said tubular substrates which are to be coated, and the electrode is arranged coaxially with respect to the ring.

12. Apparatus as claimed in claim 11 in which the electrode comprises the inside surface of the envelope which is made of metal.

* * * * *